(12) United States Patent
Talbot et al.

(10) Patent No.: US 8,274,272 B2
(45) Date of Patent: Sep. 25, 2012

(54) PROGRAMMABLE DELAY MODULE TESTING DEVICE AND METHODS THEREOF

(75) Inventors: Gerald R. Talbot, Concord, MA (US); Hanwoo C. Cho, Acton, MA (US); Brian Amick, Brookline, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 780 days.

(21) Appl. No.: 12/366,973

(22) Filed: Feb. 6, 2009

(65) Prior Publication Data
US 2010/0201343 A1    Aug. 12, 2010

(51) Int. Cl.
G01R 25/00    (2006.01)
G01R 31/02    (2006.01)
(52) U.S. Cl. .................... 324/76.77; 324/537
(58) Field of Classification Search ............... 324/76.77
See application file for complete search history.

(56) References Cited

U.S. PATENT DOCUMENTS

| | | | | |
|---|---|---|---|---|
| 6,057,691 | A * | 5/2000 | Kobayashi | 324/76.77 |
| 6,476,594 | B1 * | 11/2002 | Roisen | 324/76.54 |
| 7,251,765 | B2 * | 7/2007 | Kushiyama et al. | 714/733 |
| 7,266,738 | B2 * | 9/2007 | Sato | 714/718 |
| 7,512,872 | B2 * | 3/2009 | Awaji et al. | 714/814 |
| 2006/0097763 | A1 * | 5/2006 | Schmitt et al. | 327/158 |
| 2008/0297216 | A1 * | 12/2008 | Chiang et al. | 324/76.77 |
| 2009/0051396 | A1 * | 2/2009 | Shimamoto | 324/76.62 |

* cited by examiner

*Primary Examiner* — Timothy J Dole

(57) ABSTRACT

A data processing device is configured so that, in a test mode of operation, the phase of an output signal of a second programmable delay module (PDM) is based on the phase of the input signal of the first PDM. To test the first and second PDMs, the output signal of the first PDM is set to each of a first set of phases and the corresponding phase of the output signal of the second PDM is compared to determine whether the performance of the first and second PDMs match a specification. Accordingly, the first and second PDMs are qualified based on their relative performance, reducing the need for test structures that consume an undesirably large amount of area.

20 Claims, 4 Drawing Sheets

PROGRAMMABLE DELAY MODULE TESTING DEVICE AND METHODS THEREOF

FIELD OF THE DISCLOSURE

The present disclosure relates generally to electronic devices, and more particularly to testing of data processing devices.

BACKGROUND

Data processing devices frequently employ multiple clock signals to synchronize the operations of the device. In order to reduce the impact of signal propagation delays, clock skew, and other clock signal perturbations on device performance, it is sometimes desirable to adjust the phase of one or more of the device clock signals relative to a reference clock signal. One phase adjustment technique includes the use of a programmable delay module (PDM) such as a phase locked loop (PLL) and a delay locked loop (DLL). Because phase adjustment of clock signals can have an impact on device performance, it is typically desirable to test each PDM to ensure its performance matches a specification. However, because PDMs typically include analog circuitry and do not operate in a purely synchronous manner, testing of these devices can be difficult and require considerable device area be dedicated to test-related circuitry.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

A data processing device is configured so that, in a test mode of operation, the phase of an output signal of a second programmable delay module (PDM) is based on the phase of the input signal of the first PDM. To test the first and second PDMs, the output signal of the first PDM is set to each of a first set of phases and the corresponding phase of the output signal of the second PDM is compared to determine whether the performance of the first and second PDMs match a specification. Accordingly, the first and second PDMs are qualified based on their relative performance, reducing the need for test structures that consume an undesirably large amount of area.

Figure 1:
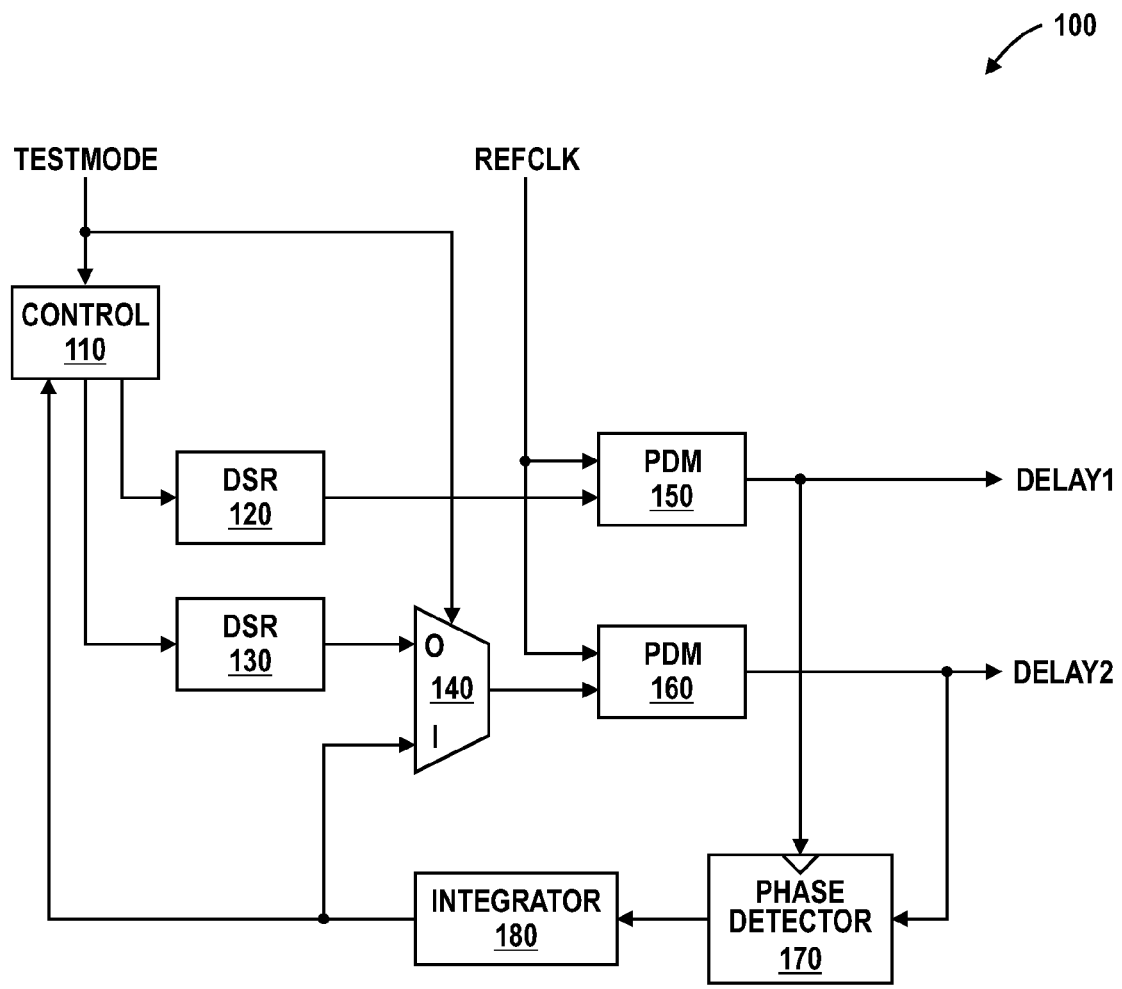
FIG. 1 illustrates in block diagram form a data processing device in accordance with a specific embodiment of the present disclosure.

FIG. 1 illustrates in block diagram form a data processing device 100 in accordance with a specific embodiment of the present disclosure. Data processing device 100 includes a control module 110, delay selection registers (DSR) 120 and 130, a multiplexor 140, PDM devices 150 and 160, a phase detector 170, and an integrator 180.

Control module 110 has an input to receive a signal labeled "TESTMODE," an output connected to DSR 120, another output connected to DSR 130, and an input connected to an output of integrator 180. DSR 120 has an output connected to PDM 150. Multiplexor 140 has a select input to receive signal TESTMODE, a first data input connected to an output of DSR 130, a second data input connected to the output of integrator 180, and an output. PDM 150 has a clock input to receive a signal labeled "REFCLK," an input connected to the output of DSR 120, and an output to provide a signal labeled "DELAY1." PDM 160 has an input to receive signal REFCLK, an input connected to the output of multiplexor 140, and an output to provide a signal labeled "DELAY2." Phase detector 170 has a clock input to receive signal DELAY1, a data input to receive signal DELAY2, and an output connected to an input of integrator 180.

Under normal operating conditions, signal TESTMODE is negated. Control module 110 can load delay values into DSR 120 and 130, and the delay provided by PDM 150 and 160 are determined by these values, respectively. PDM 150 and 160 are each configurable to provide at their output a digital signal that represents signal REFCLK delayed by the selected amount of time. For example, in an embodiment, PDM 150 can be configured to delay signal REFCLK by one of sixty-four unique amounts of time. The delay times may represent particular fractions of the cycle period of signal REFCLK. The cycle period of signal REFCLK may be referred to as a unit interval (UI). Thus, PDM 150 can be configured to provide signal DELAY1 that represents signal REFCLK delayed by any of sixty-four discrete amounts of time, from $0/64$ up to $63/64$ of one UI. This can be better understood with reference to FIG. 2.

Figures 2, 3:
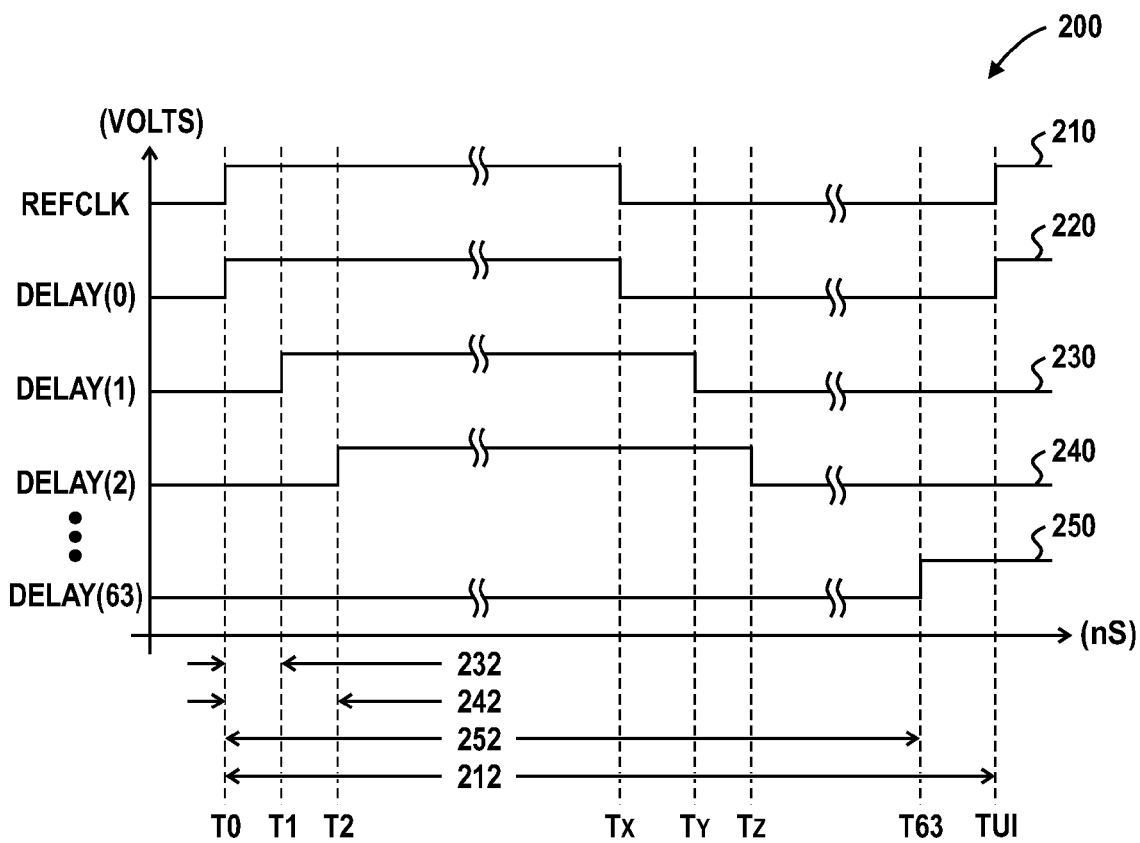
FIG. 2 is a timing diagram illustrating a particular embodiment of the operation of the programmable delay module of FIG. 1.
FIG. 3 is a table illustrating a method for testing the programmable delay module of FIG. 1 in accordance with a specific embodiment of the present disclosure.

FIG. 2 is a timing diagram 200 illustrating the operation of a PDM of FIG. 1. Timing diagram 200 has a horizontal axis representing time, specified in units of nano-seconds, and a vertical axis representing voltage, in volts, relative to each included waveform. Timing diagram 200 includes waveforms 210, 220, 230, 240, and 250, and time intervals 212, 232, 242, and 252. For the purpose of example, timing diagram 200 illustrates the operation of PDM 150, as configured by DSR 120.

Waveform 210 represents signal REFCLK, which transitions from a logic-low level to a logic-high level at a time reference, labeled "T0," transitions back to a logic-low level at a time reference labeled "TX," and once again to a logic-high level at a time reference labeled "TUI." A time interval 232 represents the period of signal REFCLK, and is referred to as a unit interval.

Waveform 220 represents a signal DELAY(0), which transitions from a logic-low level to a logic-high level at a time reference, labeled "T0," transitions back to a logic-low level at a time reference labeled "TX," and once again to a logic-high level at a time reference labeled "TUI." Signal DELAY(0) represents the output of PDM 150, (DELAY1) when configured to provide a delay of $0/64^{th}$ of a UI, corresponding to a delay selection value of zero contained at DSR 120. DELAY(0) is thus substantially the same as signal REFCLK. Signal DELAY1 provided by PDM 150 can include additional skew relative to signal REFCLK due to device delay and signal propagation delay introduced by PDM 150. For example, signal waveform 220 can be delayed relative to signal REFCLK (not shown) when configured to provide a delay of $0/64^{th}$ of a UI.

Waveform 230 represents a signal DELAY(1), which transitions from a logic-low level to a logic-high level at a time reference, labeled "T1," and transitions back to a logic-low level at a time reference labeled "TY." Signal DELAY(1) represents the output of PDM 150, when configured to provide a delay of $1/64^{th}$ of a UI, corresponding to a delay selection value of one contained at DSR 120. Interval 232 represents a delay, or phase-shift of signal DELAY(1) relative to signal REFCLK.

Waveform 240 represents a signal DELAY(2), which transitions from a logic-low level to a logic-high level at a time reference, labeled "T2," and transitions back to a logic-low level at a time reference labeled "TZ." Signal DELAY(2) represents the output of PDM 150, when configured to provide a delay of $2/64^{th}$ of a UI, corresponding to a delay selection value of two contained at DSR 120. Interval 242 represents a delay, or phase-shift of signal DELAY(2) relative to signal REFCLK.

Waveform 250 represents a signal DELAY(63), which transitions from a logic-low level to a logic-high level at a time reference, labeled "T63." Signal DELAY(63) represents the output of PDM 150, when configured to provide a delay of $63/64^{th}$ of a UI, corresponding to a delay selection value of sixty-three contained at DSR 120. Interval 252 represents a delay, or phase-shift of signal DELAY(63) relative to signal REFCLK. As described with reference to waveform 220, waveforms 230, 240, and 250 can include additional delay relative to signal REFCLK (not shown) due to device delay and signal propagation delay introduced by PDM 150.

Timing diagram 200 also illustrates the two concepts of monotonicity and linearity. Monotonicity is demonstrated by the observation that the corresponding delays provided by PDM 150 increase as the respective delay value specified by DSR 120 is increased. Linearity refers to the degree to which the delay provided by PDM 150 is generally linearly proportional to the delay value specified by DSR 120. In a particular embodiment, the delay provided by PDM 150 does not exhibit perfect linearity. Instead, a device specification may indicate a degree of linearity, expressed as a percentage, absolute units of measure, or other terms that describe a deviation of a realized delay relative to an ideal configured delay value. A manufacturing test procedure will therefore categorize PDM 150 as passing or failing on the basis of whether the variation between observed linearity and desired linearity is within or exceeds a predetermined tolerance, respectively.

Returning to FIG. 1, PDM 150 and 160 can be configured to provide signals DELAY1 and DELAY2, respectively, each signal delayed with respect to signal REFCLK by a desired amount of time. Therefore, signals DELAY1 and DELAY2 are phase-shifted variations of signal REFCLK.

Phase detector 170 is a flip-flop wherein the signal DELAY1 is used as a clock to latch the signal DELAY2. For example, when the phase of the signal DELAY1 is ahead of the phase of the signal DELAY2, then the output of phase detector 170 will be at a logic low level. When the phase of the signal DELAY1 lags that of the signal DELAY2, then the output of phase detector 170 will be at a logic high level. Phase detector 170 thus provides a binary indication of the phase difference between the signals DELAY1 and DELAY2, and can be referred to as a binary phase detector.

Integrator 180 includes a counter that is incremented for each cycle of a clock, such as REFCLK, that the signal provided at the output of phase detector 170 is at a logic high level, and decremented for each cycle of the clock that the signal provided at the output of phase detector 170 is at a logic low level. The counter typically includes more bits than are required by the phase adjustment circuit. For example, if integrator 180 includes 6 bits and thus supports sixty-four unique choices of delay, then the counter at integrator 180 can include twelve bits. The most significant six bits of the counter are used to control the delay of PDM 160, and the least significant six bits serve to further integrate the phase information received from phase detector 170. Phase detector 170 and integrator 180 can be implemented in another manner, and the manner selected may depend on the implementation of PDMs 150 and 160

In operation, data processing device 100 can operate in a normal mode or test mode of operation. The mode of operation is indicated by the signal TESTMODE, which can be controlled by an internal register (not shown) of the data processing device 100, by a signal applied to an input/output pin (not shown) of the data processing device 100, and the like. Control module 110 can configure operation of logic blocks 120-180 during normal operation and during the execution of a test procedure. DSRs 120 and 130 are registers that configure the desired delays of PDMs 150 and 160, respectively. PDMs 150 and 160 can be DLLs or another type of delay circuit. Multiplexor 140 determines whether the delay provided by PDM 160 is configured by DSR 130 (under normal operation), or by integrator 180 (during testing).

In the normal mode, it is assumed that the signal TESTMODE is negated. When the signal TESTMODE is negated, control module 110 is configured to load delay values into DSR 120 and 130 based on information received from other modules (not shown) of the data processing device 100. In this mode of operation, the PDMs 150 and 160 can each be employed for one or more of a number of purposes. For example, a PDM can be used to adjust when data is acquired by a latch by introducing delay to the latch enable clock, or to the latch input data, thereby manipulating the data setup or data hold characteristics of the latch. A PDM device may also be used to implement a PLL for generating a clock signal based on another clock signal, including a frequency-multiplied version of another clock. A PLL can be used to synthesize a clock signal from some forms of data signals via a process known as clock data recovery. A PDM such as a DLL can be used to create a suitable clock for latching data transmitted using a source-synchronous method.

The assertion of signal TESTMODE configures delay circuit 100 to operate in a test mode of operation. When configured in the test mode, PDM 160 no longer receives delay selection values from DSR 130. Instead, PDM 160 receives delay selection values from integrator 180. Control module 110 can configure PDM 150 to provide a particular delay by storing the desired delay value into DSR 120. Phase detector 170 provides an indication of the relative phase of signal DELAY1 and DELAY2, and integrator 180 controls the delay provided by PDM 160. PDM 160, phase detector 170, and integrator 180 forms a negative feedback circuit where the delay provided by PDM 160 is automatically adjusted until the average phase error seen by phase detector 170 is substantially zero. When signals DELAY1 and DELAY2 are substantially in phase, PDM 160 is said to be locked to PDM 150.

In a particular embodiment, the lock procedure is not instantaneous, so a suitable wait-time is allowed to elapse while PDM 160 locks to signal DELAY1. Following the wait-time, integrator 180 contains a delay value derived by the locking procedure, and the delay value at integrator 180 can be accessed by control module 110. The derived delay value at integrator 180 corresponds to how much PDM 160 delayed signal REFCLK in order for signal DELAY2 to be in phase with signal DELAY1

During a test procedure a delay value is loaded into DSR 120, and PDM 160 is given time to lock to the signal provided by PDM 150. The delay value loaded into DSR 120 is compared to the derived delay value accessed from integrator 180 after PDM 160 has locked phase with PDM 150, and the difference between the delay values is noted. The procedure described can be repeated in the same manner using a range of delay values at DSR 120, and comparing each respective delay value with the corresponding delay value derived at integrator 180. This process can be better understood with reference to FIG. 3.

FIG. 3 is a table 300 illustrating a method for testing the programmable delay module of FIG. 1. Table 300 includes 4 columns 392, 394, 396, and 398, and eight rows 310, 320, 330, 340, 350, 360, 370, and 380. Column 392 is labeled "DSR CONTROL," column 394 is labeled "LOCK DELAY," column 396 is labeled "DELTA," and column 398 is labeled "PASS/FAIL." Each row corresponds to one test of a set of tests. For each test, DSR 120 is configured to a delay specified by the DSR CONTROL field, and a delay derived at integrator 180 is recorded at the adjacent LOCK DELAY field. The difference between the DSR CONTROL value and the LOCK DELAY is recorded at the adjacent DELTA field. A value at the adjacent PASS/FAIL field cannot be determined until the set of tests has been completed.

Due to device variations inherent in a manufacturing process, and to differences in signal propagation that may exist between two PDM devices, the delay value derived at integrator 180 (LOCK DELAY) may not be the same as the delay value configured at DSR 120 (DSR CONTROL). A set of tests using different delays can be used to examine if the difference between the DSR CONTROL and LOCK DELAY remains substantially constant. Therefore, the test procedure can be repeated for a desired number of unique delay values. For example, table 300 illustrates repeating the test procedure using DSR CONTROL values of 0, 8, 16, 24, 32, 40, 48, and 56. For each respective test, corresponding LOCK DELAY values of 5, 13, 22, 29, 36, 45, 66, and 61 are recorded. The difference between the respective DSR CONTROL and LOCK DELAY values are calculated and corresponding DELTA values of 5, 5, 6, 5, 4, 5, 8, and 5 are recorded. Analysis of the DELTA values indicates that there is an average skew between PDM 150 and PDM 160 that corresponds to a programmed delay of approximately 5 delay units, or $5/64^{th}$ of the UI. Deviation from the average skew is −1 (DELTA=4) to +3 (DETLA=8). A deviation of $3/64^{th}$ is approximately 5%.

The degree of consistency between each of the DELTA values indicates the degree of linearity between PDM 150 and PDM 160. A technical specification will define acceptable parametric tolerances and the set of tests can identify devices that fail to achieve the operating requirements. For example, the specification may state that linearity is guaranteed to be within three percent of ideal. The results illustrated at table 300 indicate that the device exceeded the published operating performance limits at row 370 and has therefore failed the particular test. Note that the test may not identify which of PDM 150 and PDM 160 is defective. In another embodiment, a test can associate a PDM device with one or more additional PDM devices, and a particular failure can be isolated to a specific PDM device.

The test procedure described can be conducted under the direction of a state machine included at control module 110, or by a test module resident on the data processing device (not shown). The test procedure can thereby be administered without or with minimal external control, thus providing a self-test capability. In another embodiment, control module 110 can be configured by automated test equipment (ATE) via a test interface provided at control module 110 (not shown). For example, ATE can administer the test procedure using a Joint Test Action Group (JTAG) interface. Individual registers, such as DSR 120 and DSR 130 can be provided with a JTAG interface and delay values can be stored and retrieved at the registers using the JTAG interface.

Figure 4:
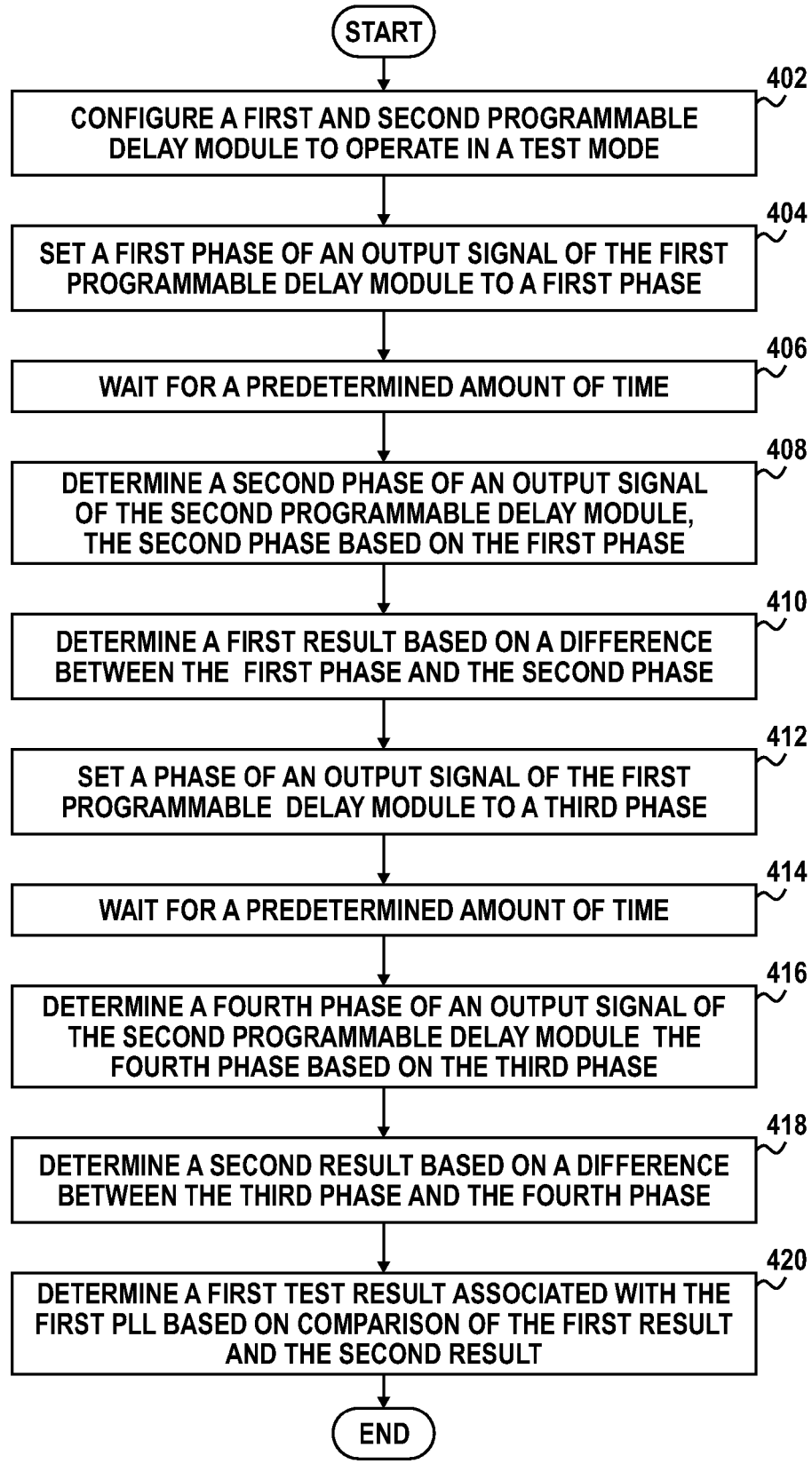
FIG. 4 is a flow diagram illustrating a particular embodiment of the method of FIG. 3 for testing the programmable delay module of FIG. 1.

FIG. 4 is a flow diagram 400 illustrating the method of FIG. 3 for testing the programmable delay modules of FIG. 1. Flow diagram 400 is described with reference to FIG. 1. At block 402, a first and a second programmable delay module such as PDM 150 and PDM 160 are configured to operate in a test mode. At block 404, control module 110 sets the phase of the first programmable delay module to a first phase, such as by writing a delay value to DSR 120. At block 406, a predetermined amount of time is allowed to elapse, during which, the phase of PDM 160 is locked to PDM 150 using phase detector 170 and integrator 180. At block 408, a second phase of an output signal of PDM 160 is determined by reading the derived delay value at integrator 180. At block 410, a first result is determined based on a difference between the first phase and the second phase.

At block 412, the phase of PDM 150 is set to a third phase. At block 414, a predetermined amount of time is allowed to elapse. At block 416, a fourth phase of an output signal of PDM 160 is determined, the fourth phase based on the third phase. At block 418, a second result is determined based on a difference between the third phase and the fourth phase. At block 420, a first test result is determined associated with PDM 150 and PDM 160 based on a comparison of the first result and the second result. For example, flow diagram 400 can correspond to the rows 310 and 320 at FIG. 3. PDM 150 is configured to a first phase of value zero, and PDM 160 returns a second phase value of five. The first result (DELTA) is therefore determined to be five. PDM 150 is then configured to a third phase of value eight, and PDM 160 returns a fourth phase value of thirteen. The second result (DELTA) is therefore determined to also be equal to five. The first test result is determined based on the first result and the second result. If testing were limited to only these two test values, PDM 150 and PDM 160 would be classified as functional. As illustrated at FIG. 3, further testing performed over a greater range of delay values identified behavior outside of the specified limits.

Figure 5:
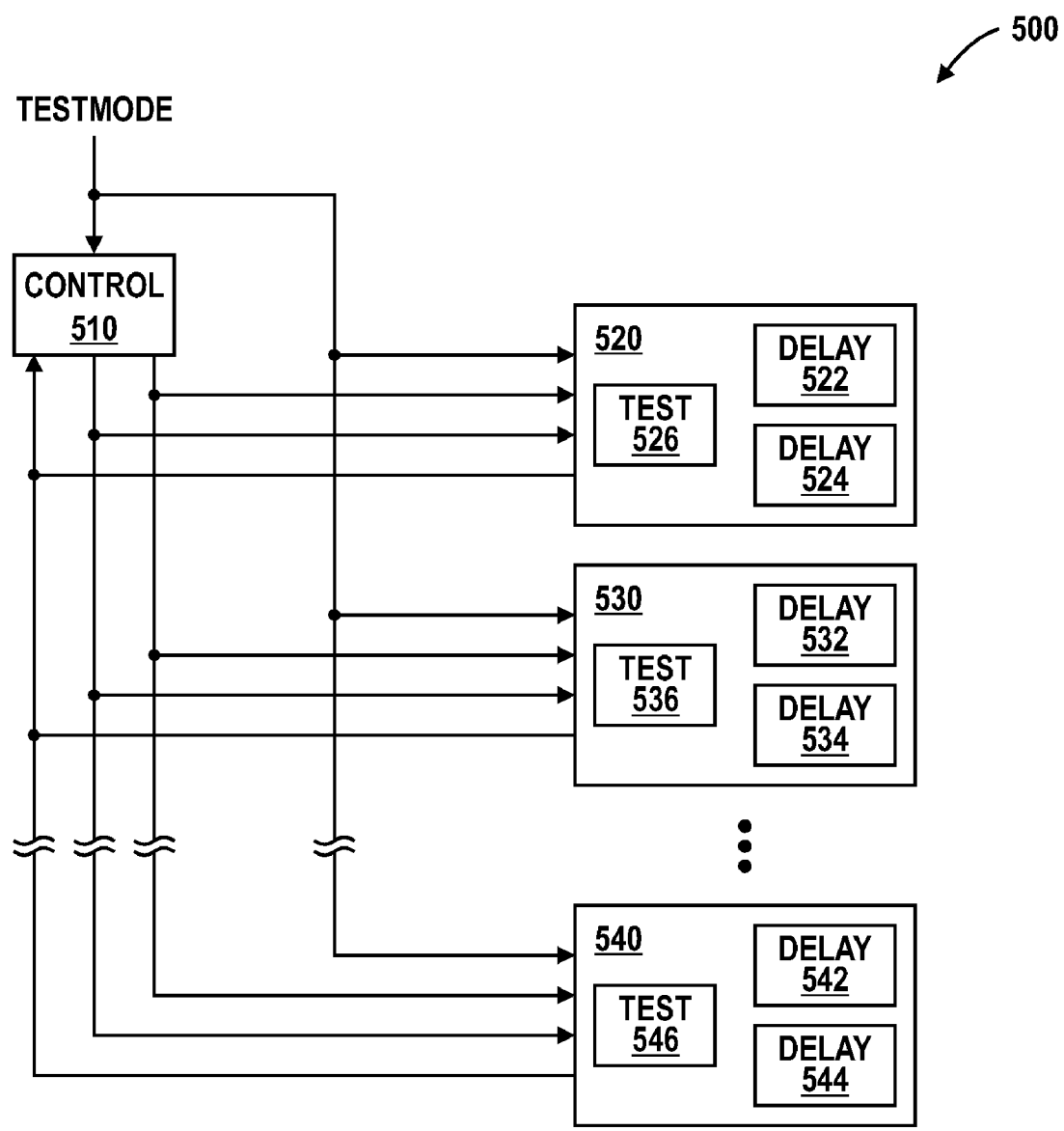
FIG. 5 is a block diagram illustrating a data processing device in accordance with a specific embodiment of the present disclosure.

FIG. 5 is a block diagram illustrating a portion 500 of a data processing device including devices for testing programmable delay modules in accordance with a specific embodiment of the present disclosure. Portion 500 includes a control module 510 and delay module pairs 520, 530, and 540. Delay module pair 520 includes delay modules 522, 524, and test module 526. Delay module pair 530 includes delay modules 532, 534, and test module 536. Delay module pair 540 includes delay modules 542, 544, and test module 546.

Delay module pair 520 has a first input connected to control module 510, a second input connected to control module 510, a third input to receive signal TESTMODE, and an output connected to control module 510. Delay module pair 530 has a first input connected to control module 510, a second input connected to control module 510, a third input to receive signal TESTMODE, and an output connected to control module 510. Delay module pair 540 has a first input connected to control module 510, a second input connected to control module 510, a third input to receive signal TESTMODE, and an output connected to control module 510.

Each of delay pair 520, 530, and 540 represents modules 120-180 illustrated at FIG. 1. Portion 500 illustrates how individual delay modules can be grouped into pairs to support manufacturing testing. Each pair of delay modules is associated with a corresponding test module, and testing of each pair is accomplished as previously described with reference to FIGS. 1-4. The individual delay modules making up each pair will typically be selected based on their physical proximity. Each delay module can be configured to operate in a normal mode, and its delay can be configured by control module 510. When signal TESTMODE is asserted, the second PDM of each pair is configured to lock to the phase of the corresponding first PDM of the pair. The derived delay available at the integrator module associated with the second PDM can be accessed by control module 510 and compared to the first PDM delay, as previously described.

In an embodiment of the present disclosure, groups of three delay modules can be organized so that any one of the three delay modules can be phase locked to other modules within the group, thereby permitting the test procedure to isolate faulty behavior to a specific delay module. Such an arrangement also can support testing to more aggressive operating specifications since the effect of cumulative nonlinearity of two delay modules can be mathematically removed.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   setting a phase of an output signal of a first programmable delay module (PDM) to a first phase, the first phase based on a first value at a first register;
   determining a second phase of an output signal of a second PDM, the second phase based on a second value at a second register, the second value based on the first phase, wherein the second register is provided by an integrator which includes a counter;
   determining a first result based on a difference between the first value and the second value; and
   determining a first test result based on the first result.

2. The method of claim 1, further comprising:
   setting the phase of the output signal of the first PDM to a third phase, the third phase based on a third value at the first register;
   determining a fourth phase of the output signal of the second PDM, the fourth phase based on a fourth value at the second register, the fourth value based on the third phase and the fourth phase;
   determining a second result based on a difference between the third value and the fourth value; and
   wherein determining the first test result comprises determining the first test result based on the first result and the second result.

3. The method of claim 1, wherein determining the first test result comprises indicating a failed test in response to determining the first value does not match the second value.

4. The method of claim 1, wherein determining the first test result comprises indicating a failed test in response to determining the first value does not match the second value within a predetermined tolerance.

5. The method of claim 1, further comprising:
   setting the phase of the output signal of the first PDM to a third phase, the third phase based on a third value at the first register;
   determining a fourth phase of the output signal of a third PDM, the fourth phase based on a fourth value at a third register, the fourth value based on the third phase, wherein the third register is provided by a second integrator which includes a second counter;
   determining a second result based on a difference between the third value and the fourth value; and
   wherein determining the first test result comprises determining the first test result based on the first result and the second result.

6. The method of claim 1, wherein the output signal of the first PDM and the output signal of the second PDM are based on a common clock signal.

7. The method of claim 1, wherein determining the second phase comprises determining the second phase in response to determining a predetermined amount of time has elapsed after setting the phase of the output signal of the first PDM to the first phase.

8. The method of claim 1, wherein determining the second phase of the output signal of the second PDM comprises determining the phase in response to an indication that an integrated circuit device is in a test mode of operation.

9. The method of claim 1 wherein the second value at the second register is determined based on integration of periodic indications of a difference in phase between the first phase and the second phase.

10. A method, comprising:
    setting a phase of an output signal of a first programmable delay module (PDM) to each of a first plurality of phases, wherein the second register is provided by an integrator which includes a counter;
    determining a second plurality of phases associated with an output signal of a second PDM, each of the second plurality of phases based on a corresponding phase of the first plurality of phases;
    determining a first plurality of difference measurements associated with the first plurality of phases and the second plurality of phases, a first difference measurement of the first plurality of difference measurements representing a difference between a first value at a first register, the first register for specifying a delay provided by the first PDM, and a second value at a second register, the second register for determining a delay provided by the second PDM; and
    determining a first test result associated with the first PDM based on the first plurality of difference measurements.

11. The method of claim 10, wherein determining the first test result comprises indicating a failed test in response to determining the first value does not match the second value.

12. The method of claim 10, wherein determining the first test result comprises indicating a failed test in response to determining the first value does not match the second value within a predetermined tolerance.

13. The method of claim 10, wherein the output signal of the first PDM and the output signal of the second PDM are based on a common clock signal.

14. The method of claim 10, wherein determining a first phase of the second plurality of phases comprises determining the first phase of the second plurality of phases in response to determining a predetermined amount of time has elapsed after setting the phase of the output signal of first PDM to a first phase of the first plurality of phases.

15. The method of claim 10, wherein determining the second plurality of phases of the output signal of the second PDM comprises determining the phases in response to an indication that an integrated circuit device is in a test mode of operation.

16. The method of claim 10, wherein the first plurality of phases comprises 8 phases.

17. The method of claim 10, wherein the first plurality of phases comprises 16 phases.

18. The method of claim 10 wherein the second value at the second register is determined based on integration of periodic indications of a difference in phase between the first phase and the second phase.

19. A device, comprising:
a first programmable delay module (PDM) comprising an input and an output;
a second PDM comprising an input coupled to the output of the first PDM and an output;
a control module comprising an output coupled to the input of the first PDM, and an input coupled to the output of the second PDM, the control module configured to:
set a phase of an output signal of the first PDM to a first phase, the first phase based on a first value at a first register;
determine a second phase of an output signal of the second PDM, the second phase based on a second value at a second register, the second value based on the first phase, wherein the second register is provided by an integrator which includes a counter;
determine a first result based on a difference between the first value and the second value; and
determine a first test result based on the first result.

20. The device of claim 19, wherein the control module is configured to:
set the phase of the input signal of the first PDM to a third phase, the third phase based on a third value at the first register;
determine a fourth phase of the output signal of a third PDM, the fourth phase based on a fourth value at a third register, the fourth value based on the third phase, wherein the third register is provided by a second integrator which includes a second counter;
determine a second result based on a difference between the third value and the fourth value; and
determine the first test result based on the first result and the second result.

* * * * *

UNITED STATES PATENT AND TRADEMARK OFFICE
CERTIFICATE OF CORRECTION

| | | |
|---|---|---|
| PATENT NO. | : 8,274,272 B2 | Page 1 of 1 |
| APPLICATION NO. | : 12/366973 | |
| DATED | : September 25, 2012 | |
| INVENTOR(S) | : Gerald R. Talbot et al. | |

It is certified that error appears in the above-identified patent and that said Letters Patent is hereby corrected as shown below:

In the Claims

Column 8, Line 44, please change "phases, wherein the second register is provided by an integrator which includes a counter;" to --phases;--

Column 8, Line 58, please change "the second PDM; and" to --the second PDM, wherein the second register is provided by an integrator which includes a counter; and--

Signed and Sealed this
Eleventh Day of March, 2014

Michelle K. Lee
*Deputy Director of the United States Patent and Trademark Office*